United States Patent
Sasaki et al.

[11] Patent Number: 5,241,236
[45] Date of Patent: Aug. 31, 1993

[54] PIEZOELECTRIC CERAMIC TRANSFORMER BEING DRIVEN WITH THICKNESS EXTENSIONAL VIBRATION

[75] Inventors: Yasuhiro Sasaki; Kaneo Uehara; Takeshi Inoue, all of Tokyo, Japan

[73] Assignee: NEC Corporation, Tokyo, Japan

[21] Appl. No.: 861,436

[22] Filed: Apr. 1, 1992

[30] Foreign Application Priority Data

Apr. 2, 1991 [JP] Japan .................................. 3-069609

[51] Int. Cl.$^5$ ........................................... H01L 41/08
[52] U.S. Cl. ................................... 310/358; 310/328; 310/366
[58] Field of Search ................. 310/328, 366, 312, 358

[56] References Cited

U.S. PATENT DOCUMENTS

| | | | |
|---|---|---|---|
| 3,487,239 | 12/1969 | Schafft ......................... | 310/366 X |
| 3,489,931 | 1/1970 | Teaford ......................... | 310/366 X |
| 3,590,287 | 6/1971 | Berlincourt et al. ........... | 310/366 X |
| 4,564,782 | 1/1986 | Ogawa ........................... | 310/366 X |
| 5,118,982 | 6/1992 | Inoue et al. ................... | 310/366 |

Primary Examiner—Mark O. Budd
Attorney, Agent, or Firm—Leydig, Voit & Mayer

[57] ABSTRACT

A piezoelectric ceramic transformer comprises a low impedance portion 11 including a plurality of piezoelectric ceramic layers 111 to 115 having different thicknesses, a high impedance portion 12 and internal electrodes 16. The low and high impedance portions 11 and 12 are subjected to a uniform polarization treatment in a thickness direction and with the same vector of polarization. The low impedance portion 11 includes one or more piezoelectric ceramic layers having a thickness different from those of the other layers therein. No delamination of electrodes or breaking of ceramics occur upon polarization treatment. Therefore, a compact piezoelectric ceramic transformer for power source which has a high mechanical quality coefficient Qm and a high electric power transmission efficiency is provided.

20 Claims, 4 Drawing Sheets

PIEZOELECTRIC CERAMIC TRANSFORMER BEING DRIVEN WITH THICKNESS EXTENSIONAL VIBRATION

BACKGROUND OF THE INVENTION

1. Field of the Invention

The present invention relates to a piezoelectric ceramic transformer, which is operable at a high frequency band and more particularly to a piezoelectric ceramic transformer for an onboard power supply whose smaller size and lower noise are demanded.

2. Description of Prior Art

Many efforts have been made to make the switching frequency of a switching power source higher for providing more compact electronic equipment. An electromagnetic transformer has heretofore been used for the switching power source. As the switching frequency is increased, the power loss due to hysteresis loss and eddy current loss of the magnetic material used in the electromagnetic transformer and the loss due to the skin effect of the conductor are sharply increased, resulting in a considerably low efficiency of the transformer. Accordingly, the upper limit of the practical frequency of the electromagnetic transformer is at most 500 kHz.

In contrast to the general electromagnetic transformer, the piezoelectric ceramic transformer is used in a resonant mode and has a number of advantages as follows:

(1) The size of the transformer can be made smaller since the energy density at the same frequency is higher, (2) The transformer can be made nonflammable.

(3) No noise due to electromagnetic induction is generated.

The structure of a Rosen type piezoelectric transformer which is a typical prior art piezoelectric transformer will be described with reference to FIG. 1 as follows. In a piezoelectric ceramic plate for outputting a high voltage which is provided with electrodes on surfaces thereof, a reference numeral 41 denotes a low impedance drive portion of the piezoelectric transformer, which is provided with electrodes 43 and 44 on the upper and lower surface thereof, respectively. A reference numeral 42 denotes a high impedance generating portion which is provided with an electrode 45 on the end side thereof and the portion 42 is polarized in a longitudinal direction of the piezoelectric ceramic plate as represented by a reference numeral 47. The piezoelectric transformer functions as follows: When a voltage is applied across the driving electrodes 43 and 44, length vibration is excited at an electromechanical coupling factor $k_{31}$ in a transverse effect 31 mode so that the whole of the transformer vibrates. In the generating portion 42, a high voltage can be outputted from the output electrode 45 in a longitudinal vibration 33 mode due to longitudinal effect at an electromechanical coupling factor $k_{33}$.

On the other hand, in the case that it is desired to output a low voltage by inputting a high voltage, it is apparent that it will be sufficient to use the longitudinal effect high impedance portion 42 and the transverse effect low impedance portion 41 as input and output sides, respectively. Any of the other piezoelectric transformers utilizes elongation vibration of a flat plate which is same as that of the Rosen type piezoelectric transformer and radial expanding vibration of a disc in a radial direction and thus has an applicable frequency which is up to 200 kHz.

The present inventors have proposed a piezoelectric ceramic transformer having a structure in which piezoelectric ceramic plates which have been polarized in a thickness direction are stacked and which is capable of operating in the order of MHz band by being driven at a resonant frequency in a thickness extensional vibration (refer to U.S. patent application Ser. No. 530,930, filed on May 30, 1990).

When the multilayer piezoelectric ceramic transformer using a thickness extensional vibration mode which has been already proposed by the present inventors is driven, if the polarization of the low impedance portion is uniform in a thickness direction and has the same vector of polarization and the thickness of each ceramic layer is uniform, cancellation of electric charges occurs in the whole of the low impedance portion resulting in that electric fields induced by the ceramic layers are cancelled with each other. Briefly, the stored electrostatic energy is cancelled, resulting in a decrease in electric power transmission efficiency.

In the prior art polarization method, the whole of the element was uniformly polarized in a thickness direction and thereafter the ceramic layers of the low impedance portion were polarized in opposite directions with each other. In this method, delamination of electrodes or breaking of the piezoelectric ceramic layers partially occurs due to mechanical strain associated with reversal of polarization in the low impedance portion. Thus, there is a disadvantage that the mechanical quality coefficient Qm of the piezoelectric ceramic transformer lowers and the electric power transmission efficiency of the piezoelectric ceramic transformer is low.

It has been also difficult to provide the proposed piezoelectric transformer with a plurality of pairs of output terminals in view of its structure.

SUMMARY OF THE INVENTION

It is therefore an object of the present invention to provide a piezoelectric ceramic transformer which overcomes the above mentioned problems.

It is therefore an object of the present invention to provide a piezoelectric transformer which is low in loss and has an enough capability at high driving frequencies of 1 MHz or more, and to provide a compact piezoelectric ceramic transformer for power source which has a high mechanical quality coefficient Qm and a high electric power transmission efficiency.

In order to accomplish the above mentioned object of the present invention, there is provided a piezoelectric ceramic transformer being driven with a thickness extensional vibration and having a structure in which internal electrodes and piezoelectric ceramic layers are alternately stacked and low and high impedance portions are formed in the stack, characterized in that the low impedance portion comprises a plurality of piezoelectric ceramic layers wherein one or more piezoelectric ceramic layers which are thinner than the other piezoelectric ceramic layers are disposed in the position where the distribution of electric charge is maximum when the transformer is driven or in the vicinity thereof and in that the every piezoelectric ceramic layer between the internal electrodes is polarized in a thickness direction and with the same vector of polarization.

There is also provided a piezoelectric ceramic transformer being driven with a thickness extensional vibration and having a structure in which internal electrodes and piezoelectric ceramic layers are alternately stacked and low and high impedance portions are formed in the stack and in which the low and high impedance portions are simultaneously polarized in a thickness direction and with the same vector of polarization, characterized in that the thickness of the stack is adjusted to make the frequency in a half or one wave length mode of the thickness extensional vibration equal to a given frequency by abrading the upper and lower surfaces of the stack which are located in its thickness direction so that the surfaces become parallel with each other and planar and that the transformer is driven at the resonant frequency.

DESCRIPTION OF THE PREFERRED EMBODIMENTS

The present invention will be described in more detail with reference to the accompanying drawings.

Figure 1:
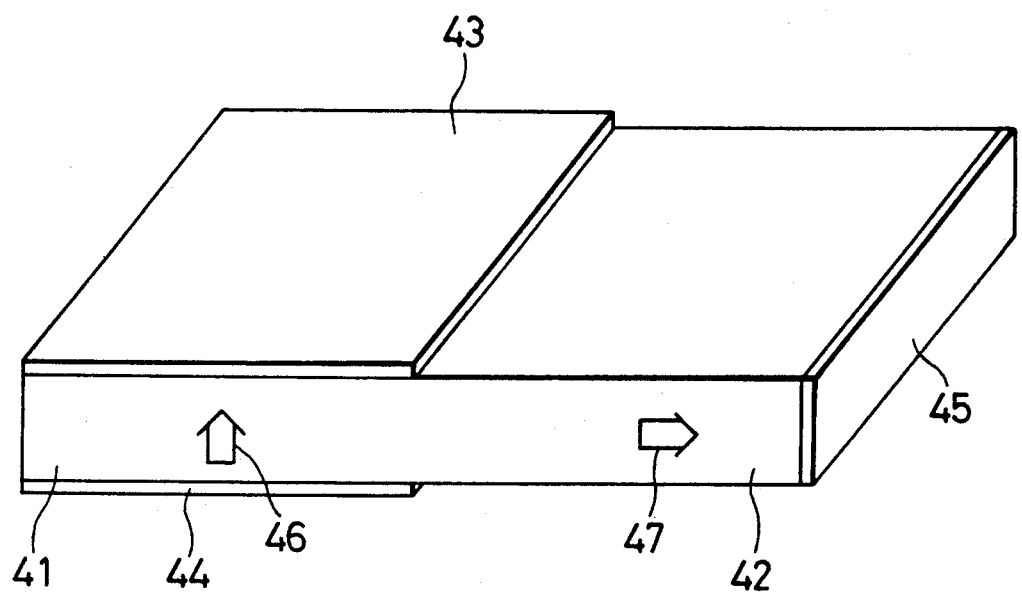
FIG. 1 is an oblique view of a prior art Rosen type piezoelectric transformer.
Figure 2:
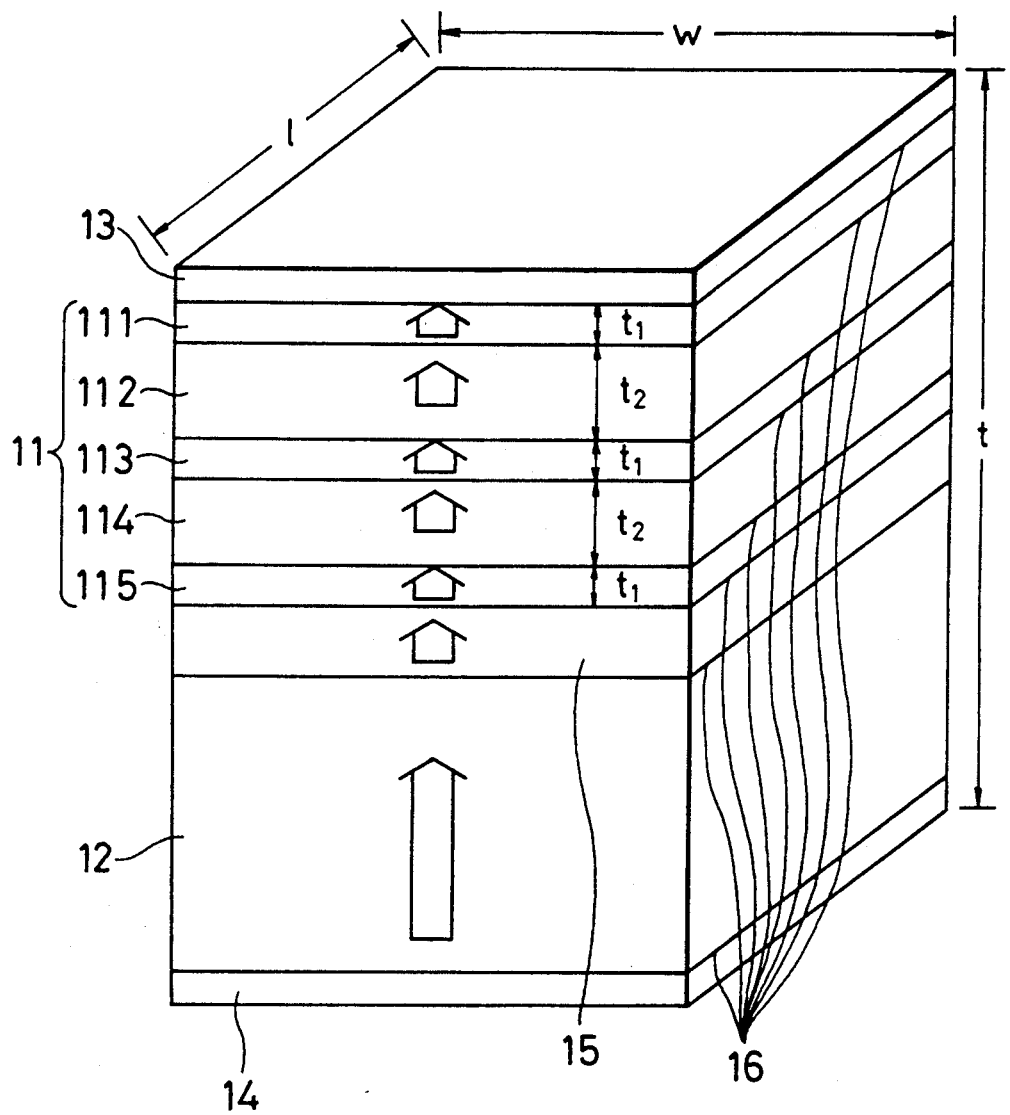
FIG. 2 is an oblique view of an embodiment of a piezoelectric ceramic transformer according to the present invention.

Referring now to FIG. 2, there is shown an embodiment of the piezoelectric ceramic transformer in accordance with the present invention as discussed above.

As exemplarily shown in FIG. 2, a piezoelectric ceramic transformer of the present invention comprises a low impedance portion 11 which is a stack of a plurality of piezoelectric ceramic layers, for example, a stack of five piezoelectric ceramic layers 111 to 115, the layers being polarized in a thickness direction and having different thicknesses, a high impedance portion 12 including a single or at most 2 or 3 piezoelectric ceramic layers, frequency adjusting ceramic layers 13 and 14, an insulating layer 15 which serves to electrically isolate the low impedance portion 11 from the high impedance portion 12 and internal electrodes 16 sandwiched between the layers. The piezoelectric ceramic layers 111 to 115 of the low impedance portion 11 are stacked so that the layers are uniformly polarized in the thickness direction and with the same vector of polarization (the piezoelectric ceramic transformer is polarized from one side of the large surfaces to the other side thereof) and the thicknesses of the layers have a relation $t_2 > t_1$. It is clear that the electric power transmission efficiency becomes higher as the high capacitance ceramic layer having a thickness of $t_1$ which includes two opposing electrodes 16 is close to a position where the distribution of electric charge is maximum. Designing such a structure can realize a piezoelectric ceramic transformer in which cancellation of electric charges in the low impedance portion is less, thus, the electric power transmission efficiency is high.

Because of driving the piezoelectric ceramic transformer with a thickness extensional vibration resonant mode, a material suppressed spurious vibration of piezoelectric transverse effect, i.e. having an anisotropy of the electromechanical coupling factors, for example, modified lead titanate ceramics is used. Conventionally, the whole of an element is uniformly polarized in a thickness direction and the same vector of polarization and thereafter the low impedance portion is subjected to polarization once more so that the ceramic layers sandwiched between the electrodes are polarized in opposite directions with each other. If this method is used for the piezoelectric ceramic transformer which is made of a material having a high axial ratio of the crystal c/a such as modified lead titanate ceramics, delamination of the electrodes and partial breaking of the piezoelectric ceramics easily occur since the strain related with reversal of polarization in the low impedance portion is high. Delamination of electrodes and breaking of piezoelectric ceramics lower the electric power transmission efficiency. The present piezoelectric transformer is simultaneously polarized once for both high and low impedance portions in the thickness direction and with the same vector of polarization, whereby delamination of electrodes and breaking of piezoelectric ceramics can be completely prevented.

The piezoelectric ceramic transformer having such a multilayer structure with internal electrodes can be fabricated by a multilayer ceramic technology such as a tape casting process which can be used in fabrication of a multilayer ceramic capacitor or multilayer piezoelectric actuator. The individual layers of the fabricated piezoelectric ceramic transformer can be reduced to about 20 μm thick. Even if the thickness extensional vibration of resonance is used in a half wave length mode (a fundamental mode in which the opposite ends are free) or one wave length mode (a secondary mode in which the opposite ends are free), a piezoelectric ceramic transformer which is operable at a high frequency of 5 to 10 MHz can be also realized by the multilayer ceramic technology.

The piezoelectric ceramic transformer as shown in FIG. 2 was fabricated according to a multilayer ceramic technology as follows. For a piezoelectric material, modified lead titanate ceramics (manufactured by Kabushiki Kaisha Tohkin, trade name NEPEC-200) was used.

Three piezoelectric ceramic plates 111, 113 and 115 about 0.17 mm thick and two piezoelectric ceramic plates 112 and 114 about 0.34 mm thick were stacked so that the thinner plates 111, 113 and 115 alternated with the thicker plates 112 and 114 to form the low impedance portion 11. A ceramic plate 113 about 0.17 mm thick was disposed in a position where the distribution of electric charge is maximum. The high impedance portion 12 was about 1.4 mm thick and the insulating layer 15 sandwiched between the low and high impedance portions 11 and 12 was 0.2 mm thick. A frequency adjusting layers 13 and 14 were formed of the same material and was about 0.1 mm thick. As for a material for the frequency adjusting layers 13 and 14, any material may be used if it can be fired so that it is integral with the low and high impedance portions 11 and 12. The external dimensions of the piezoelectric ceramic transformer were about 1.8 mm in length (l) × 1.4 mm in width (w) × 2.8 mm in thickness (t).

Then, internal electrodes 16 of platinum were formed by printing a platinum paste on a piezoelectric ceramics plate and firing integrally therewith. After firing, the resulting multilayer ceramic product was abraded with a #3000 abradant on the upper and lower surfaces thereof so that the upper and lower surfaces become parallel with each other and planar. Thereafter, the ceramic product was subjected to a polarization treatment by applying a D.C. high voltage thereon.

Figure 3:
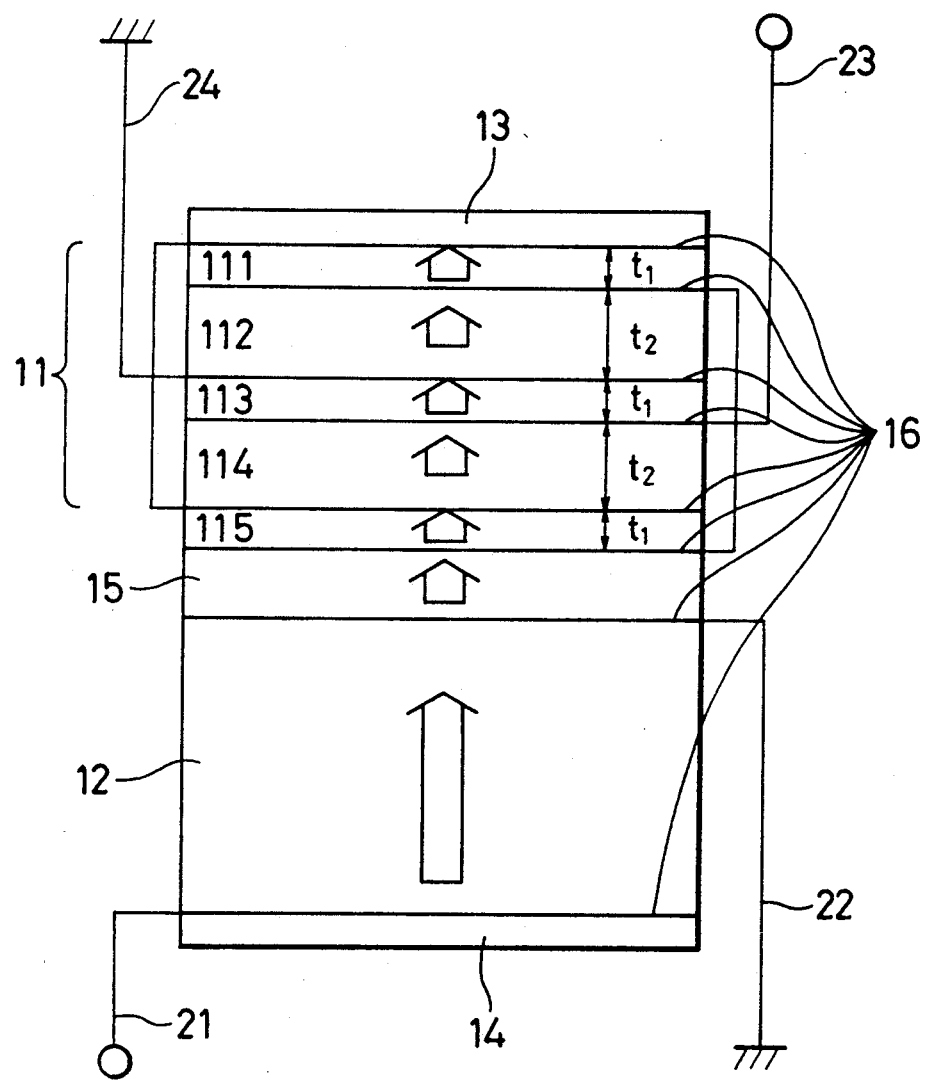
FIG. 3 is a connection view of an embodiment of a piezoelectric ceramic transformer according to the present invention.

Referring now to FIG. 3, there is shown a connection diagram of a piezoelectric ceramic transformer which is driven by the thickness extensional vibration. Electrical terminals 23 and 24 are connected with the internal electrodes 16 of the low impedance portion 11 as illustrated in the drawing. In the piezoelectric ceramic transformer in which the terminal 23 and 24 are connected with the electrodes 16 in such a manner, when a high voltage having a frequency equal to a resonant frequency of the thickness extensional vibration is applied across the electrical terminals 21 and 22 in the high impedance side, the piezoelectric ceramic transformer mechanically resonates due to piezoelectric negative effect of the high impedance portion 12 and the low impedance portion 11 generates across the terminals 21 and 22 a voltage having a frequency equal to that of an input voltage due to piezoelectric positive effect. At this time, the voltage across the terminals 23 and 24 is lower than the voltage across the terminals 21 and 22 due to difference in impednaces of the input and output sides. Conversely, in case where it is desired to transform a lower voltage into a higher voltage, it is of course possible to output the higher voltage across the terminals 21 and 22 if the lower voltage is applied across the terminals 23 and 24.

Figure 4:
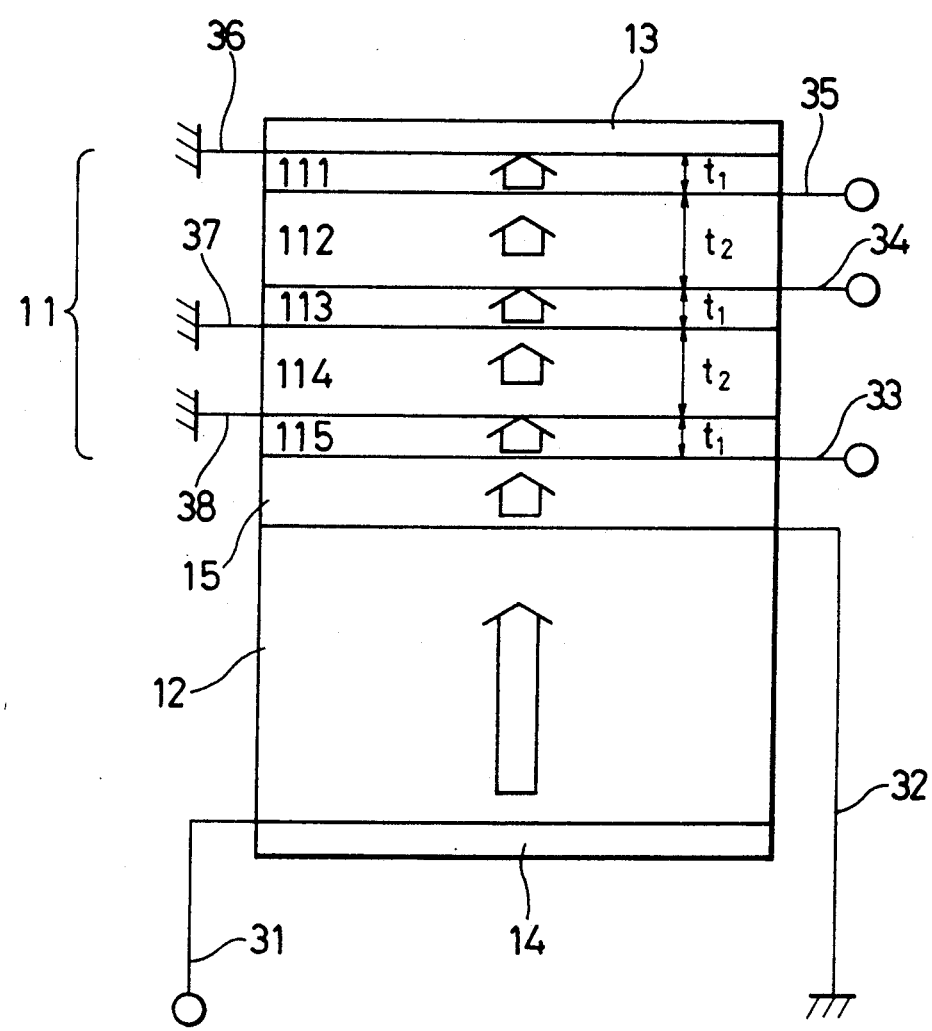
FIG. 4 is a connection view of another embodiment of a piezoelectric ceramic transformer according to the present invention.

In FIG. 3, there is shown the connection diagram for the piezoelectric ceramic transformer of the present invention in which the high impedance portion 12 has one-line input terminals and the low impedance portion 11 has one-line output terminals wherein each of the piezoelectric ceramic layers 111 to 115 is sandwiched between the facing internal electrodes 16 and the ceramic layers with electrodes on both surfaces are in parallel connected. Incidentally, as shown in FIG. 4, if electrical terminals 33 to 38 are independently connected with internal electrodes 16, respectively, there is provided pairs of multi-line output terminals and thus it is possible to obtain several transformation ratios.

Since the terminals 21 and 22 can be electrically isolated from the terminals 23 and 24 if the insulating layer 15 is disposed between the low and high impedance portions 11 and 12 as shown in FIG. 3, the freedom degree of the peripheral circuit can be enhanced.

In the above embodiment as shown in FIG. 3, the piezoelectric ceramic transformer of the present invention was fabricated and evaluated as a step-down type four terminal transformer in which a high frequency and high voltage signal of the 2nd order thickness extensional vibration (one wave-length and resonant mode) is applied across the terminals 21 and 22 of the high impedance portion 12 and an output signal is outputted from the terminals 23 and 24 of the low impedance portion 11.

On the other hand, there was fabricated a comparative piezoelectric ceramic transformer which has the same external dimensions as those of the above piezoelectric ceramic transformer of the present invention but in which there are differences in the following points. Namely, the comparative transformer comprises ceramic layers for forming a low impedance portion each of which has a uniform thickness ($t_1 = t_2 =$ about 0.25 mm) and was subjected to a uniform polarization treatment in the thickness direction and with the same vector of polarization and then was subjected to a further polarization treatment so that the polarization directions in the ceramic layers of the low impedance portion alternate with each other in a thickness direction. The comparative transformer had an electric power transmission efficiency of 85% at a driving resonant frequency of 1.62 MHz while the above piezoelectric ceramic transformer of the present invention had an electric power transmission efficiency of 98% at a drive resonant frequency of 1.64 MHz.

In another embodiment, a piezoelectric ceramic transformer of the present invention which was similarly subjected to a polarization treatment as shown in FIG. 4 was fabricated and evaluated as a step-down type eight terminal transformer having one-line two input terminals in a high impedance portion and three-line six output terminals in a low impedance portion. Different transformation ratios were obtained in every pair of output terminals in the low impedance portion. The electric power transmission efficiency is as high as 98% at a drive frequency of 1.64 MHz.

As described above, the piezoelectric ceramic transformer of the present invention overcomes the drawbacks of the prior art piezoelectric ceramic transformer which has been discussed and can be used in a high frequency band not lower than 1 MHz, and is compact and has a high efficiency unlike the prior art piezoelectric transformer. Therefore, the industrial value is very high.

What is claimed is:

1. A piezoelectric ceramic transformer being driven with a thickness extensional vibration and having a structure in which internal electrodes and piezoelectric ceramic layers are alternately stacked and low and high impedance portions are formed in said stack,
    said low impedance portion comprising a plurality of piezoelectric ceramic layers wherein one or more piezoelectric ceramic layers which are thinner than the other piezoelectric ceramic layers are disposed close to the position where the distribution of electric charge is maximum when said transformer is driven and
    wherein every piezoelectric ceramic layer between said internal electrodes is polarized in a thickness direction and with the same vector of polarization.

2. The piezoelectric ceramic transformer as defined in claim 1 in which the thickness of said stack is adjusted to make the frequency in a half or one wave length mode of the thickness extensional vibration equal to a given frequency by abrading the upper and lower surfaces of said stack which are located in its thickness direction so that said surfaces become parallel with each other and planar and in which said transformer is driven at the resonant frequency.

3. The piezoelectric ceramic transformer as defined in claim 1 in which said high impedance portion has one-line input terminals and said low impedance portion has one-line output terminals, said internal electrodes of said low impedance portion being connected in parallel to said output terminals.

4. The piezoelectric ceramic transformer as defined in claim 1 in which said high impedance portion has one-line input terminals and said low impedance portions has multi-line output terminals, said internal electrodes of said low impedance portion being independently connected to said output terminals.

5. The piezoelectric ceramic transformer as defined in claim 1 in which said low impedance portion comprises five piezoelectric ceramic layers two layers of which are said thinner layers.

6. The piezoelectric ceramic transformer as defined in claim 1 in which said high impedance portion comprises one to three piezoelectric ceramic layers.

7. The piezoelectric ceramic transformer as defined in claim 1 in which said piezoelectric ceramic layers are composed of a modified lead titanate ceramics and said polarization is uniformly performed simultaneously and once for both of said low and high impedance portions.

8. The piezoelectric ceramic transformer as defined in claim 1 in which said transformer is a step-down type transformer.

9. The piezoelectric ceramic transformer as defined in claim 1 in which said transformer is a step-up type transformer.

10. The piezoelectric ceramic transformer as defined in claim 1 in which said high impedance portion has one-line two input terminals and said low impedance portion has one-line two output terminals.

11. The piezoelectric ceramic transformer as defined in claim 1 in which said high impedance portion has one-line two input terminals and said low impedance portion has three-line six output termimals.

12. The piezoelectric ceramic transformer as defined in claim 1 in which said transformer is used in a high frequency band not lower than 1 MHz.

13. A piezoelectric ceramic transformer being driven with a thickness extensional vibration which comprises a low impedance portion comprising a stack of a plurality of piezoelectric ceramic layers having different thicknesses; a high impedance portion including one to three piezoelectric ceramic layers; frequency adjusting ceramic layers; an insulating layer disposed between said low and high impedance portions; and internal electrodes sandwiched between said layers, wherein every piezoelectric ceramic layer between said internal electrodes is polarized in the thickness direction and with the same vector of polarization.

14. The piezoelectric ceramic transformer as defined in claim 13 in which the thickness of said stack is adjusted to make the frequency in a half or one wave length mode of the thickness extensional vibration equal to a given frequency by abrading the upper and lower surfaces of said stack which are located in its thickness direction so that said surfaces become parallel with each other and planar and in which said transformer is driven at the resonant frequency.

15. The piezoelectric ceramic transformer as defined in claim 13 in which said high impedance portion comprises one to three piezoelectric ceramic layers and said low impedance portion comprises five piezoelectric ceramic layers two layers, of which are said thinner layers.

16. The piezoelectric ceramic transformer as defined in claim 13 in which said high impedance portion has one-line two input terminals and said low impedance portion has one-line two output terminals, said internal electrodes of said low impedance portions being connected in parallel to said output terminals.

17. The piezoelectric ceramic transformer defined in claim 13 in which said high impedance portion has one-line two input terminals and said low impedance portion has three-line six output terminals, said internal electrodes of said low impedance portion being independently connected to said output terminals.

18. The piezoelectric ceramic transformer as defined in claim 13 in which said piezoelectric ceramic layers are composed of a modified lead titanate ceramics and said polarization is uniformly performed simultaneously and once for both of said low and high impedance portions.

19. The piezoelectric ceramic transformer as defined in claim 13 in which said transformer is a step-down type transformer.

20. The piezoelectric ceramic transformer as defined in claim 13 in which said transformer is used in a high frequency band not lower than 1 MHz.

* * * * *